United States Patent [19]

Losapio et al.

[11] Patent Number: 4,602,211
[45] Date of Patent: Jul. 22, 1986

[54] MULTIPLE EXTERNAL CONTROL ACTUATOR FOR ELECTRONIC DEMAND REGISTER

[75] Inventors: Peter F. Losapio; Warren R. Germer, both of Dover, N.H.

[73] Assignee: General Electric Co., Somersworth, N.H.

[21] Appl. No.: 550,408

[22] Filed: Nov. 10, 1983

[51] Int. Cl.⁴ .................... G01R 11/64; G01R 11/24; H01H 3/00; G06C 15/42
[52] U.S. Cl. ................................ 324/103 R; 200/18; 235/144 MA; 324/110
[58] Field of Search .......................... 324/103 R, 110; 200/153 T, 336, 340, 18; 235/144 MA

[56] References Cited
U.S. PATENT DOCUMENTS 2,668,200  2/1954  Glaze ................................... 200/18
4,188,575  2/1980  Palmer et al. .................. 324/103 P Primary Examiner—Ernest F. Karlsen
Attorney, Agent, or Firm—Robert E. Brunson; Thomas R. Morrison

[57] ABSTRACT

An electronic demand register for an electric meter includes a plurality of pushbutton controls for controlling material displayed or a mode of operation of the demand register. A lockable switch actuator includes an actuating paddle within a cover or housing of the meter which, when unlocked, can be rotated into alignment with a selected one of the pushbutton controls and then pushed inward to actuate the selected pushbutton control. A pair of bosses bracketing one of the pushbutton controls prevents actuation of its respective control until the actuating paddle is accurately positioned between them. A second pair of bosses bracketing another of the pushbutton controls are spaced too closely apart to permit the actuating paddle to pass therebetween and they thus prevent actuation of their respective pushbutton control.

3 Claims, 4 Drawing Figures

MULTIPLE EXTERNAL CONTROL ACTUATOR FOR ELECTRONIC DEMAND REGISTER

BACKGROUND OF THE INVENTION

The present invention relates to kilowatt demand indicating meters and, more particularly, to external control actuators for selectively manually controlling a plurality of internal functions in such meters without removing the cover.

Kilowatt demand meters are known in the prior art. These demand meters originally consisted of mechanical dial-type accumulating registers which were actuated by a pusher in relation to the rate at which power was being consumed. The pusher is periodically reset leaving an indication on the accumulating registers related to the power consumed between reset periods. Over a number of reset periods, the conumsption data indicated on the accumulating registers is related to the power consumed during the highest-consumption period since the last time the accumulating registers were zeroed. Zeroing the accumulating registers is conventionally performed manually by a meter reader in the performance of his normal duties. One type of mechanical demand meter is disclosed in U.S. Pat. No. 3,586,974.

Since demand registers are an integral part of the utility billing system, prevention of tampering is necessary. The need for security against tampering is complicated by the fact that readily accessible means are necessary to permit the meter reader to reset the demand accumulating registers without a substantial investment of his time. This need has been met by, for example, key-operated actuators of the types disclosed in U.S. Pat. Nos. 4,188,575 and 4,205,520 in which a key-locked barrel passes through the meter cover. When unlocked with a key, the barrel may be pressed inward or rotated to engage an actuator in the register. The key can then be rotated to perform the zeroing or resetting action. The actuator is then disengaged and the key is removed to restore the mechanism to its locked condition.

A further type of demand register reset actuator is disclosed in U.S. Pat. No. 3,844,474 in which an external hinged lever is employed to actuate the barrel. The lever may be hinged into alignment with a stationary locking plate and be securely held in an inoperative position by a padlock shackle passing through aligned holes in the lever and the locking plate.

The recent availability of low-cost electronic storage and processing apparatus, particularly digital processors such as microprocessors, has permitted the replacement of at least some of the mechanical functions of a demand register with electronic functions. Such a digital processing system is disclosed in U.S. Pat. No. 4,301,508. The necessity for resetting such a demand register continues to exist in order to integrate the use of such electronic demand registers with mechanical registers which are likely to remain in use for many years.

One way that electronic demand registers may be reset includes, for example, switch actuators passing through the meter cover and being secured with a key-type locking barrel, a locking lever or other security device. When unlocked, the switch actuator may be moved in a predetermined fashion to actuate a reset switch.

Electronic demand registers are capable of performing many more types of reduction and display of power usage data than is economically feasible with mechanical demand registers. Normally, electronic demand registers include an electronically driven display such as for example, a light emitting diode, plasma, vacuum florescent or liquid crystal display. Such displays are capable of simultaneously displaying only a limited number of characters at a time. Some type of switching within such a demand register appears to be desirable in order to call up supplemental or alternate display material. Such supplemental or alternate display material should not, however, interfere with the routine reading and resetting periodically performed by the meter reader. In addition to merely summoning supplemental or alternate material to the display, it is also possible to take advantage of the greater flexibility of the digital processor of an electronic register to operate in alternate modes. One such alternate mode may be, for example, a test mode.

Security requirements continue to dictate the need for preventing tampering with such more flexible demand meters. In addition, certain constraints on the ease with which even an authorized person may switch display information or modes may be necessary. It remains desirable to perform at least some of the resetting and switching operations from outside the cover. It may also be desirable to bar or prevent certain switching operations from being performed from the outside at least until a mechanical change is effected inside the cover.

OBJECTS AND SUMMARY OF THE INVENTION

Accordingly, it is an object of the invention to provide a cover (housing) mounted actuator for an electronic demand register which permits actuation of a plurality of controls within the cover.

It is a further object of the invention to provide a cover mounted actuator for a plurality of controls within the cover in which at least two different procedures are required for actuation of at least two of the controls.

It is a still further object of the invention to provide a cover mounted actuator for a plurality of controls within the cover which permits actuation of at least some of the controls from within the cover.

It is a still further object of the invention to provide a cover mounted actuator for a plurality of controls within the cover which permits actuation of at least one control within the cover and prevents actuation of at least a second control within the cover unless a mechanical change has been made within the cover to permit actuation of the at least a second control.

Briefly stated, the present invention provides apparatus for actuating a plurality of pushbutton controls in an electronic demand register for an electric meter. The pushbutton controls may change the material being displayed or the mode of operation of the demand register. A lockable switch actuator includes an actuating paddle within a cover or housing of the meter which, when unlocked, can be rotated into alignment with a selected one of the pushbutton controls and then pushed inward to actuate the selected pushbutton control. A pair of bosses bracketing one of the pushbutton controls prevents actuation of its respective control until the actuating paddle is accurately positioned between them. A second pair of bosses bracketing another of the pushbutton controls are spaced too closely apart to permit the actuating paddle to pass therebetween and thus prevents actuation of their respective pushbutton control.

According to an aspect of the invention, there is provided a control actuator for an electronic demand register for an electric meter, the electric meter having a transparent cover thereon, comprising at least first and second pushbutton controls disposed in a pattern on the electronic demand register within the transparent cover, an actuating rod extending through the cover, an actuating paddle affixed to an inner end of the actuating rod, lockable means at an outer end of the actuating rod external to the cover, the lockable means including means, effective when locked, for preventing actuation of any of the at least first and second pushbutton controls and the lockable means further including means, effective when unlocked, for selectably permitting alignment of the actuating paddle with a selected one of the at least first and second pushbutton controls and for permitting inward actuation of the actuating rod and the actuating paddle whereby the actuating paddle is enabled to actuate at least one of the at least first and second pushbutton controls.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Although the present invention may be usable with a wide variety of electronic electric meters, for concreteness of description, the present disclosure is directed toward a hybrid electric meter which uses a conventional mechanical kilowatthour register and an electronic demand register.

Figure 1:
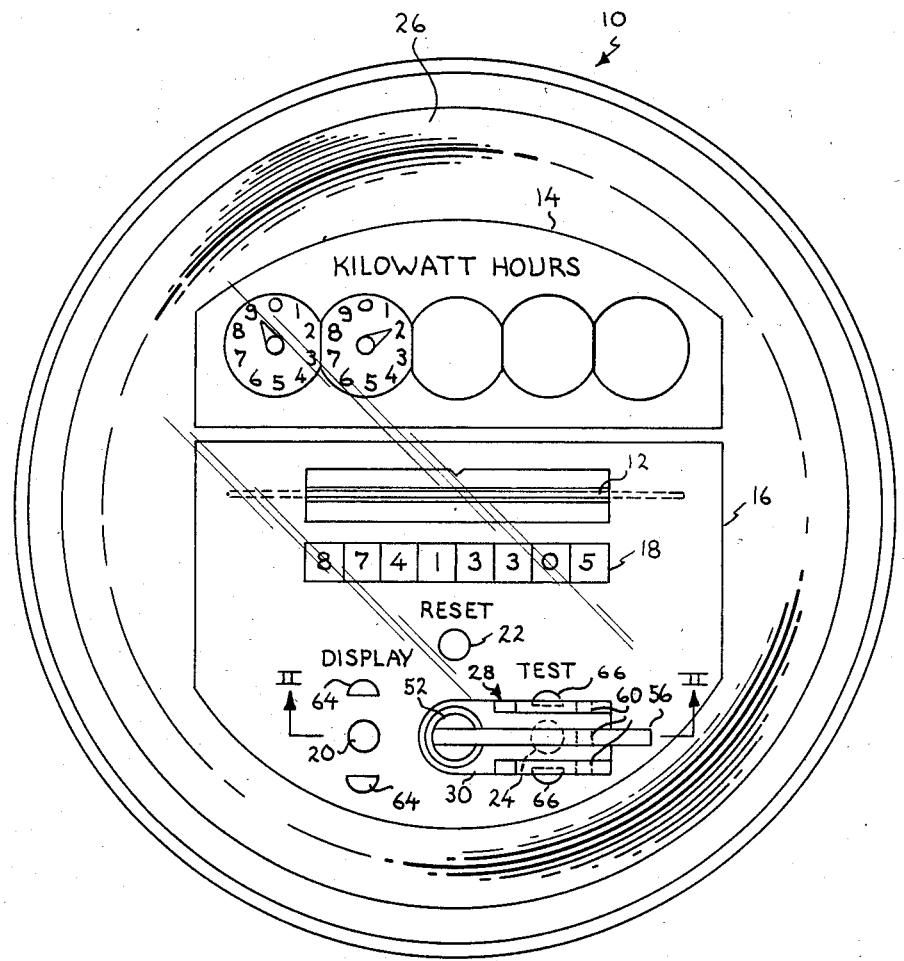
FIG. 1 is a front view of an electric meter employing a multiple control actuator according to an embodiment of the invention.

Referring now to FIG. 1, there is shown, generally at 10, an electric meter according to an embodiment of the invention. As is conventional, electric meter 10 includes a small induction motor comprising voltage and current coils (not shown) which are effective to rotate a metallic disk 12 at a speed proportional to the product of voltage and current (that is, the power) fed to a load. The rotational motion of metallic disk 12 is accumulated or integrated in a conventional kilowatthour register 14. The indications on kilowatthour register 14 are regularly read by the utility supplying the power for billing purposes.

The rotation of metallic disk 12 is also sensed for driving an electronic demand register 16. Rotation of metallic disk 12 may be sensed electronically using, for example, a cam-actuated switch, or electrooptically using, for example, a light source and a photocell. One example of this latter technique is disclosed in co-pending U.S. patent application Ser. No. 550,407, filed Nov. 10, 1983, as well as in U.S. Pat. No. 4,301,508. The sensed rotation of metallic disk 12 is applied to a microprocessor (not shown) in electronic demand register 16 wherein the data is stored and processed for deriving power demand on a per-period or other basis which may be further compartmented by time of day, day of week or season. The demand data derived by the microprocessor may be displayed on a display 18.

The ability of a microprocessor system to reduce data and make it available to a user generally exceeds the simultaneous display capacity of any practical type of display 18. In response to this problem, provisions are conventionally provided for changing the information to be displayed on display 18 and even to change the mode of operation of the microprocessor so that the microprocessor can be used for alternative functions such as troubleshooting and the like. Electronic demand register 16 includes a display pushbutton control 20, a reset pushbutton control 22 and a test pushbutton control 24 within a transparent cover 26. Although the present invention should not be limited by any particular usage, it is believed that a normal usage of electronic demand register 16 includes full-time, or on-command, display of the demand data generally parallelling the constant display of demand data on mechanical demand registers of the prior art. Once the demand data for the preceding period is read, the meter reader resets the demand display in preparation for the next period and departs. The normal routine of the meter reader is not believed to require alternate display or alternate mode. Thus, the meter reader is required only to actuate reset pushbutton control 22 after reading the demand data on display 18.

It is within the contemplation of the invention that the meter reader or other authorized person may need to be able to actuate alternate displays by actuating display pushbutton control 20 to, for example, verify that the stored calendar and/or clock time remains correct. This is contemplated to be a relatively infrequent requirement compared to the frequency with which the demand data is read and reset. It may, however, be frequent enough to require reasonably easy actuation of display pushbutton control 20.

Figure 2:
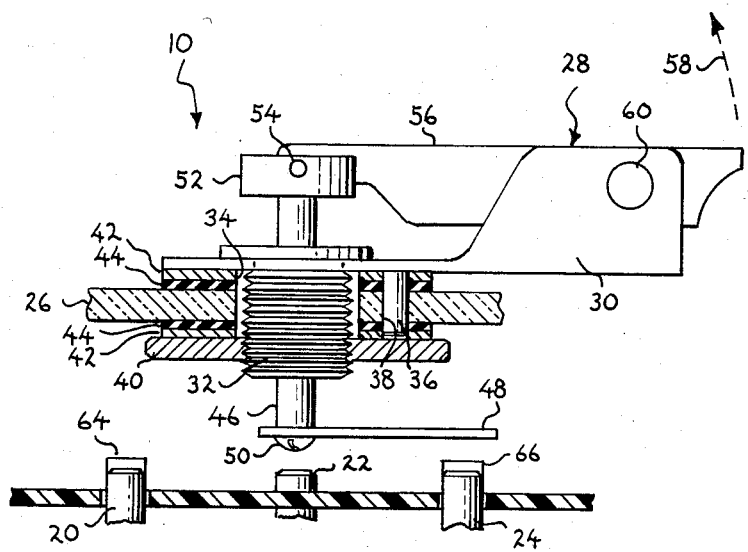
FIG. 2 is a cross section taken along II—II in FIG. 1.

An alternate mode such as, for example, a test mode, may need to be reserved for actuation by persons of special skills or needs which are beyond those normally possessed by a meter reader. Thus, it is desirable to provide means for preventing actuation of test pushbutton control 24 from outside transparent cover 26 until a mechanical change has been effected within transparent cover 26. Such a mechanical change requiring, as it does, removal of transparent cover 26 from electric meter 10, denies actuation of test pushbutton control 24 to all except those having authority to open electric meter 10. The normal security precautions applied to prevent unauthorized opening of electric meter 10 are thus effective to prevent unauthorized actuation of test pushbutton control 24.

a lockable switch actuator 28 provides the means for actuating permitted ones of display pushbutton control 20, reset pushbutton control 22 and test pushbutton control 24 from the exterior of lockable switch actuator 28. Referring now also to FIG. 2, lockable switch actuator 28 includes a U-shaped stationary member 30, attached to a threaded barrel 32 passing through a hole 34 in transparent cover 26. A pin 36, also affixed to U-shaped stationary member 30 passes through an auxiliary hole 38 for preventing rotation of lockable switch actuator 28. Appropriate nut 40 and washers 42 and 44 engage threaded barrel 32 to retain lockable switch actuator 28 in place.

An actuating rod 46 passes through the center of threaded barrel 32. An actuating paddle 48 is affixed at a lower end of actuating rod 46 by any convenient means such as, for example, a screw 50. A bushing 52 at an outer end of actuating rod 46 contains a pivot 54 about which a pivoted actuating arm 56 may be rotated in a vertical arc as indicated by a dashed arrow 58. A hole 60 in U-shaped stationary member 30 is aligned with a similar hole (not shown) in pivoted actuating arm 56 when pivoted actuating arm 56 is rotated to the locking position shown in FIG. 2. The shackle of a conventional padlock may be inserted through the aligned holes for locking pivoted actuating arm 56 in the stowed inoperative position shown. In the stowed and inoperative position shown, pivoted actuating arm 56 holds actuating rod 46 in an outward position wherein actuating paddle 48 is prevented from contacting test pushbutton control 24 and is also prevented from rotating into alignment with display pushbutton control 20 or reset pushbutton control 22.

Figure 3:
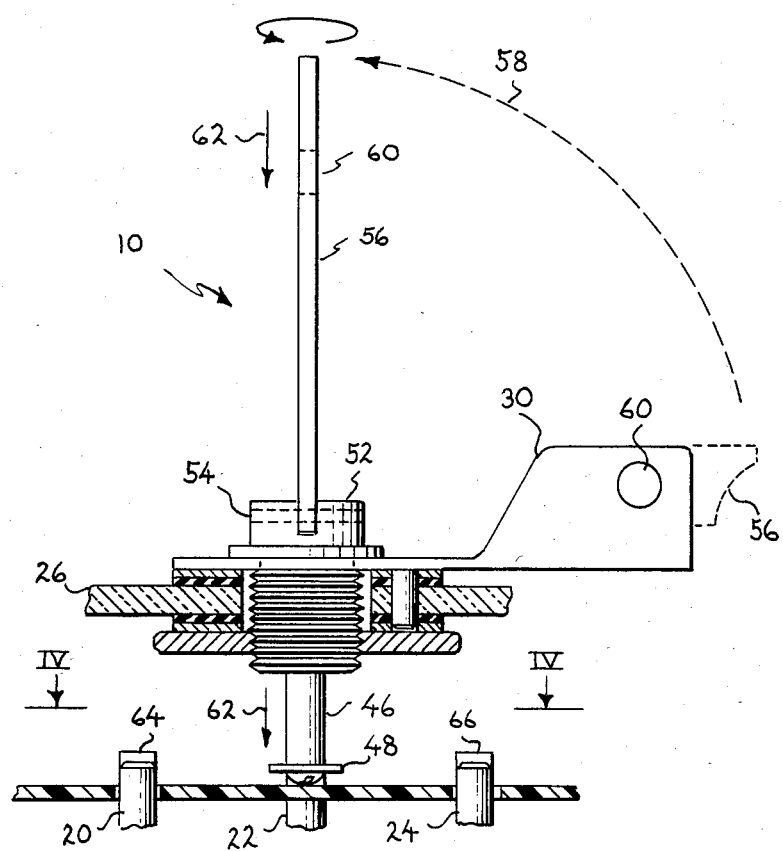
FIG. 3 is a cross section similar to FIG. 2 in which a pivoted actuating arm is pivoted into its operative position.

Referring now to FIG. 3, pivoted actuating arm 56 is shown in its operative position in which it is freed from U-shaped stationary member 30, rotated along the arc indicated by dashed arrow 58 and then rotated about its axis to move actuating paddle 48 into alignment over reset pushbutton control 22. Bushing 52 and actuating rod 46 are urged downward until actuating paddle 48 engages and presses reset pushbutton control 22 in the direction shown by an arrow 62. In the preferred embodiment, reset pushbutton control 22 actuates a conventional momentary-contact switch (not shown) for performing the resetting function.

Figure 4:
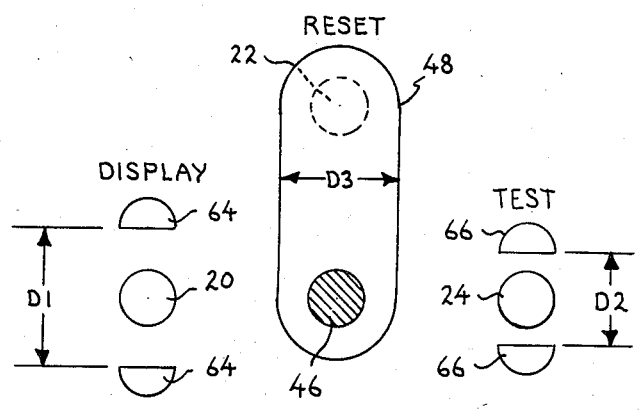
FIG. 4 is a cross section taken along IV—IV in FIG. 3.

Referring now also to FIG. 4, display pushbutton control 20 is shown bracketed by a pair of bosses 64 which extend higher than the end of display pushbutton control 20 and are spaced apart a distance D1. Similarly, test pushbutton control 24 is shown bracketed by a pair of bosses 66 which extend higher than test pushbutton control 24 and are spaced apart a distance D2. Bosses 64 and 66 interfere with actuation of their respective controls unless actuating paddle 48 can be fitted between them. The width of actuating paddle 48 is indicated by D3. In order to provide minimum complication in actuating reset pushbutton control 22, no bosses are provided adjacent to it. The spacing D1 between bosses 64 is greater than the width D3 of actuating paddle 48. Thus, actuating paddle 48 can be aligned over display pushbutton control 20 and fitted between bosses 64 by pressing downward and thereby actuating display pushbutton control 20. It is believed that the slight extra motion of retracting actuating rod 46 slightly and the slight extra precision required to position actuating paddle 48 between bosses 64 is effective to reduce the likelihood of accidental actuation without excessively complicating the actuation of display pushbutton control 20.

The spacing D2 between bosses 66 is less than the width D3 of actuating paddle 48. Thus, bosses 66 prevent actuation of test pushbutton control 24 by actuating paddle 48 unless steps, which are not of interest here, are taken to move one or both of bosses 66 or to provide an alternative to actuating paddle 48 for contacting test pushbutton control 24. In the embodiment shown and described, no provision is available for externally accomplishing a mechanical modification which would permit actuation of test pushbutton control 24 without removing transparent cover 26. However, test pushbutton control 24 is available to an authorized person who opens electric meter 10.

It would be clear to one skilled in the art that use of a lockable switch actuator 28 of the type having a pivoted actuating arm 56 is only one possible apparatus for controlling access and permitting authorized actuation of internal controls. Lockable actuator 28 may be replaced with a key-type lockable switch actuator (not shown) without departing from the spirit and scope of the invention.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A control actuator for an electronic demand register for an electric meter, said electric meter having a transparent cover thereon, comprising:
    at least first and second pushbutton controls disposed in a pattern on said electronic demand register within said transparent cover;
    an actuating rod extending through said cover;
    an actuating paddle affixed to an inner end of said actuating rod;
    said actuating paddle having a width;
    lockable means at an outer end of said actuating rod external to said cover, said lockable means including means, effective when locked, for preventing actuation of any of said at least first and second pushbutton controls;
    said lockable means further including means, effective when unlocked, for selectively permitting rotation of said actuating paddle into alignment with a selected one of said at least first and second pushbutton controls and for permitting inward actuation of said actuating rod and said actuating paddle toward said selected one;
    first and second bosses disposed at a spacing from said first pushbutton control;
    said first and second bosses having a height exceeding a height of said first pushbutton; and
    said spacing being less than said width whereby said actuating paddle is prevented from entering therebetween and actuation of said first pushbutton control is prevented.

2. A control actuator according to claim 1 wherein said means, effective when locked, for preventing actuation of any of said at least first and second pushbutton controls includes a stationary member affixed external to said cover, a hole in said stationary member, a pivoted actuating arm affixed to an outer end of said actuating rod, and a corresponding hole in said actuating arm alignable with said hole in said stationary member for permitting the locking of said actuating arm to said stationary member by a lock element passed therethrough.

3. A control actuator according to claim 1, further comprising:
    third and fourth bosses disposed at a second spacing about said second pushbutton control;
    said third and fourth bosses having heights exceeding a height of said second pushbutton control;
    said second spacing exceeding said width whereby said actuating paddle is enabled to pass therebetween for actuating said second pushbutton control after said actuating paddle is aligned between said third and fourth bosses.

* * * * *